US012652792B2

(12) United States Patent
Jeon et al.

(10) Patent No.: US 12,652,792 B2
(45) Date of Patent: Jun. 9, 2026

(54) SEMICONDUCTOR DEVICE

(71) Applicant: SAMSUNG ELECTRONICS CO., LTD., Suwon-si (KR)

(72) Inventors: Intak Jeon, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 458 days.

(21) Appl. No.: 18/320,451

(22) Filed: May 19, 2023

(65) Prior Publication Data

US 2024/0074150 A1 Feb. 29, 2024

(30) Foreign Application Priority Data

Aug. 24, 2022 (KR) ......................... 10-2022-0106106

(51) Int. Cl.
*H10B 12/00* (2023.01)
*H10D 1/68* (2025.01)
(52) U.S. Cl.
CPC ......... *H10B 12/315* (2023.02); *H10B 12/033* (2023.02); *H10D 1/68* (2025.01)
(58) Field of Classification Search
CPC ....... H10B 12/315; H10B 12/033; H01D 1/68
See application file for complete search history.

(56) References Cited

U.S. PATENT DOCUMENTS 8,481,398 B2 7/2013 Chung et al.
2007/0093034 A1 4/2007 Basceri et al.
2014/0183696 A1 7/2014 Rui et al.
2015/0279922 A1 10/2015 Chang et al.
2016/0087028 A1* 3/2016 Hirota ...................... H10D 1/68
257/532
2018/0277621 A1* 9/2018 Ando ...................... H10D 1/042
2021/0142946 A1 5/2021 Kang et al.
2021/0273039 A1* 9/2021 Kim ...................... H10D 1/716

FOREIGN PATENT DOCUMENTS

KR 10-1610826 4/2016

OTHER PUBLICATIONS

Vanderbilt, et al., "Structural and dielectric properties of crystalline and amorphous ZrO2", Thin Solid Films, 486, (2005), pp. 125-128.

* cited by examiner

*Primary Examiner* — Steven M Page
(74) *Attorney, Agent, or Firm* — Morgan, Lewis & Bockius LLP

(57) ABSTRACT

A semiconductor device includes a lower structure; a lower electrode on the lower structure; an upper electrode covering the lower electrode on the lower structure; and a dielectric structure disposed between the lower electrode and the upper electrode. The dielectric structure includes a first dielectric film including a first material and a second dielectric film including a second material different from the first material. The first dielectric film includes a first surface in contact with or facing the lower electrode and a second surface facing the first surface. The second dielectric film includes a first portion disposed in an opening of the first dielectric film and extending in a direction from the second surface toward the first surface.

18 Claims, 20 Drawing Sheets

200A

220A

282(280)

230A

242A

240A

260A

SEMICONDUCTOR DEVICE

CROSS-REFERENCE TO RELATED APPLICATION(S)

This application claims benefit of priority to Korean Patent Application No. 10-2022-0106106 filed on Aug. 24, 2022 in the Korean Intellectual Property Office, the disclosure of which is incorporated herein by reference in its entirety.

TECHNICAL FIELD

Example embodiments of the present disclosure relate generally to a semiconductor device, and more particularly to a capacitive structure in a semiconductor device.

DISCUSSION OF RELATED ART

According to demand for high integration density and miniaturization of a semiconductor device, capacitor size in semiconductor devices has also undergone miniaturization. Accordingly, various studies have been undertaken to optimize a structure of a miniaturized capacitor for storing information in semiconductor memory devices such as a dynamic random-access memory (DRAM).

SUMMARY

An example embodiment of the present disclosure relates to a semiconductor device having improved electrical properties and improved reliability.

According to an example embodiment of the present disclosure, a semiconductor device includes a lower structure; a lower electrode on the lower structure; an upper electrode surrounding the lower electrode; and a dielectric structure disposed between the lower electrode and the upper electrode. The dielectric structure includes a first dielectric film including a first material and a second dielectric film including a second material different from the first material. The first dielectric film includes a first surface in contact with or facing the lower electrode and a second surface opposite the first surface. The second dielectric film includes at least a portion disposed in an opening of the first dielectric film and extending in a direction from the second surface toward the first surface.

According to an example embodiment of the present disclosure, a semiconductor device includes a lower structure including a transistor; and a capacitor structure disposed on the lower structure and electrically connected to the transistor, wherein the capacitor structure includes a lower electrode electrically connected to the transistor and spaced apart from each other on the lower structure, an upper electrode surrounding the lower electrode on the lower structure, and a dielectric structure disposed between the lower electrode and the upper electrode, wherein the dielectric structure includes a first dielectric film including a first material and a second dielectric film including a second material different from the first material, wherein the second dielectric film has a lower surface in contact with or facing the lower electrode, an upper surface opposite to the lower surface, and a side surface, and wherein the side surface of the second dielectric film is in contact with the first dielectric film.

According to an example embodiment of the present disclosure, a semiconductor device includes a lower structure including a transistor; and a capacitor structure disposed on the lower structure and electrically connected to the transistor, wherein the capacitor structure includes a lower electrode electrically connected to the transistor and spaced apart from each other on the lower structure, an upper electrode surrounding the lower electrode on the lower structure, and a dielectric structure disposed between the lower electrode and the upper electrode, wherein the dielectric structure includes a first dielectric film including a first material and a second dielectric film including a second material different from the first material, wherein the dielectric structure has a first surface in contact with or facing the lower electrode and a second surface in contact with or facing the upper electrode, and wherein at least a portion of the first dielectric film and at least a portion of the second dielectric film are alternately disposed in a direction parallel to the first surface and the second surface between the first surface and the second surface of the dielectric structure.

According to another example embodiment, a method of manufacturing a capacitor of a semiconductor device includes: depositing a first dielectric film having a first material on a first electrode of the capacitor; etching a grain boundary of the first dielectric film to form an opening extending from an outer surface of the first dielectric film to the first electrode; depositing a second dielectric film having a second material different from the first material on the first dielectric film to form a layered dielectric structure in which a portion of the second dielectric film with the second material fills the opening; and forming a second electrode of the capacitor on the dielectric structure.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Herein, when a first element of a device structure is said to be "on" a second element, the first element may directly contact the second element, or an intermediate element may exist between the first and second elements. If a figure depicts direct contact, the figure serves as an example of the first element being "directly on" the second element, "in contact with" the second element, or the like.

Figure 1:
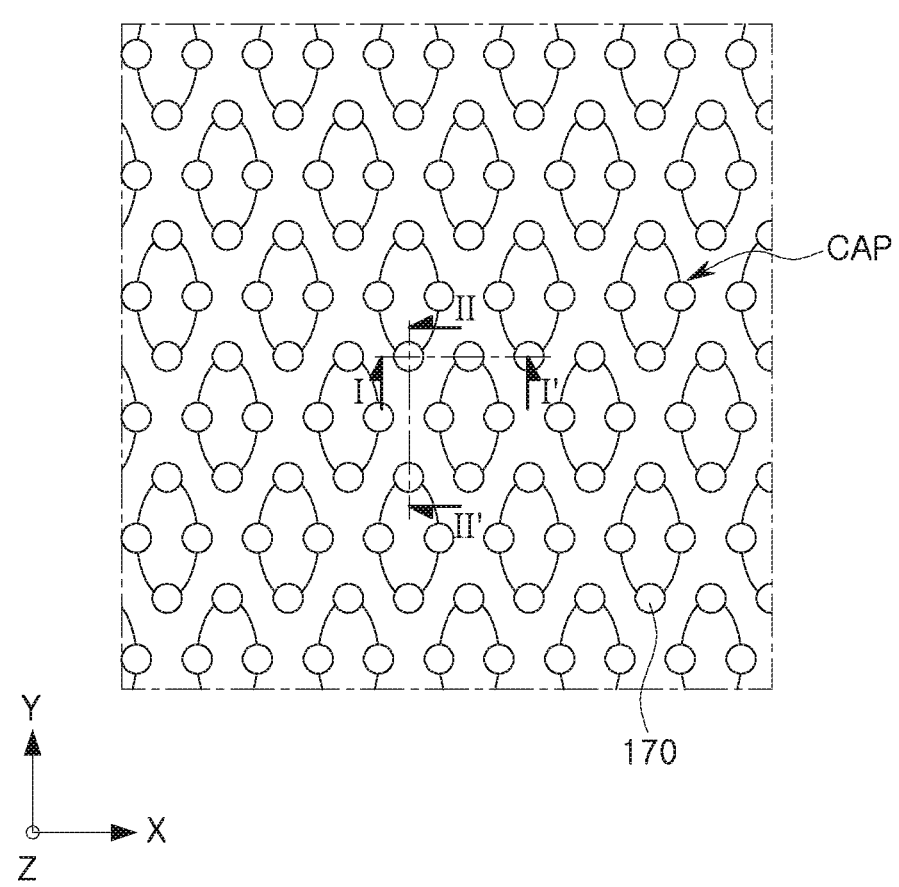
FIG. 1 is a plan view of a portion of a semiconductor device according to an example embodiment of the present disclosure.

FIG. 1 is a plan view of a portion of a semiconductor device, 100, according to an example embodiment.

Figure 2:
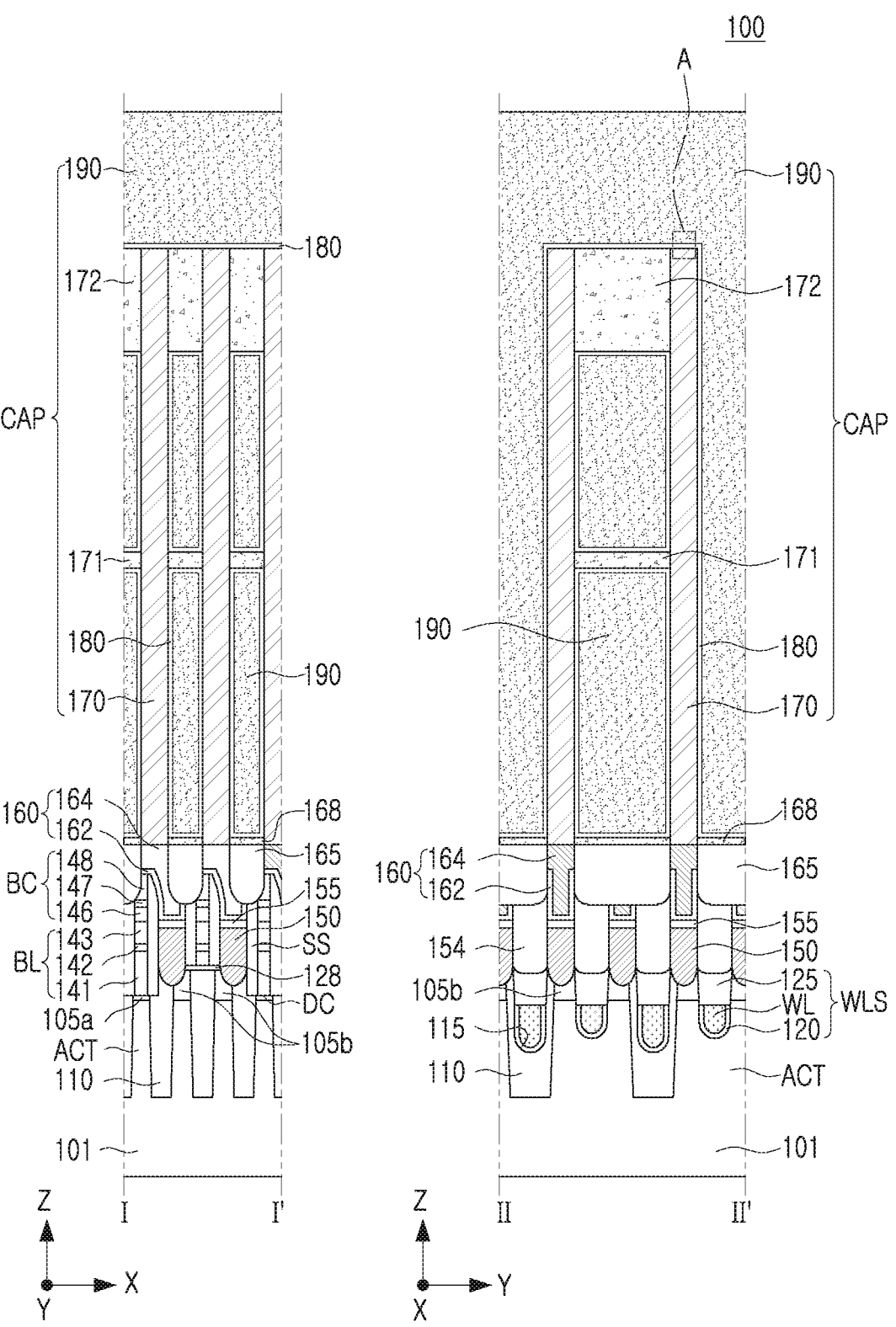
FIG. 2 is a cross-sectional view illustrating a portion of a semiconductor device structure according to an example embodiment of the present disclosure.

FIG. 2 is a cross-sectional view illustrating an example structural portion of the semiconductor device 100, taken along lines I-I' and II-IF of FIG. 1.

Figure 3:
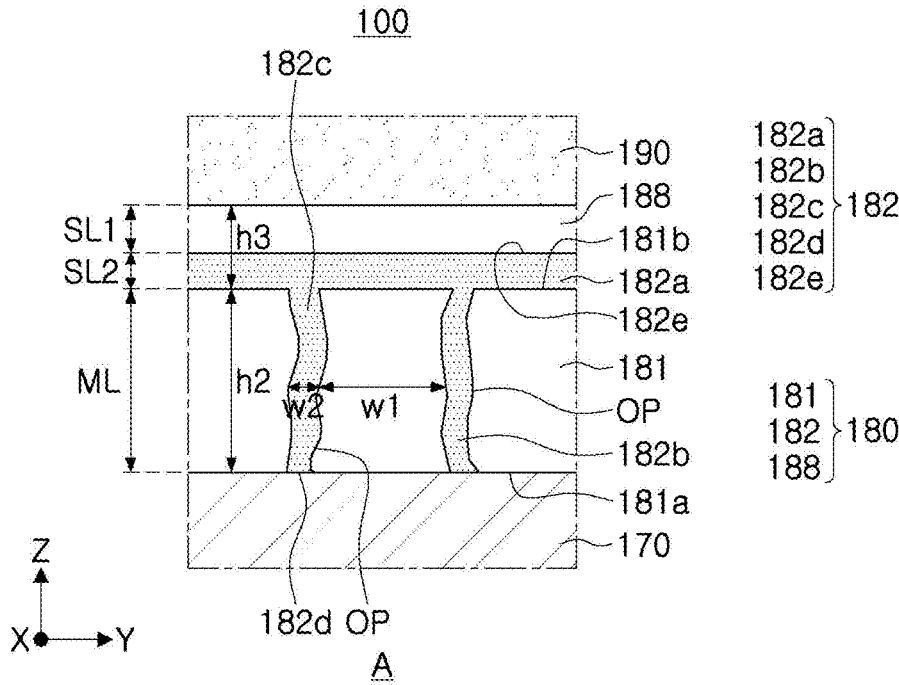
FIG. 3 is an enlarged cross-sectional view illustrating an example structure of the region "A" of the semiconductor device of FIG. 2, which is a region between first and second electrodes of a capacitor of the semiconductor device.

FIG. 3 is an enlarged cross-sectional view of the region "A" in FIG. 2, illustrating an example structure between first and second electrodes of a capacitor of the semiconductor device. The structure of FIG. 3, although exemplifying a small region "A" of a dielectric region 180 between a first electrode 170 and a second electrode 190, may be replicated similarly throughout an entire extent of the dielectric region 180.

Referring to FIGS. 1 to 3, the semiconductor device 100 may include a substrate 101 including active regions ACT, a device isolation layer 110 defining the active regions ACT within the substrate 101, a word line structure WLS embedded in the substrate 101, extending and including a word line WL, a bit line structure BLS extending by intersecting the word line structure WLS on the substrate 101 and including a bit line BL, and a capacitor structure CAP on the bit line structure BLS. The semiconductor device 100 may further include a lower conductive pattern 150 on the active region ACT, an upper conductive pattern 160 on the lower conductive pattern 150, and an insulating pattern 165 penetrating the upper conductive pattern 160. In example embodiments, a region below the capacitor structure CAP may be referred to as a lower structure, and the lower structure may include the substrate 101, the word line structure WLS, and the bit line structure BLS.

The semiconductor device 100 may be (or include) a dynamic random access memory (DRAM) cell array. For example, the bit line BL may be connected to the first impurity region 105a of the active region ACT, and the second impurity region 105b of the active region ACT may be electrically connected to the capacitor structure CAP on the upper conductive pattern 160 through the lower and upper conductive patterns 150 and 160. The capacitor structure CAP may include a lower electrode 170, a dielectric structure 180 on the lower electrode 170, and an upper electrode 190 on the dielectric structure 180. The capacitor structure CAP may further include an etch stop layer 168 and support layers 171 and 172. The semiconductor device 100 may include a cell array region in which a cell array is disposed and a peripheral circuit region in which peripheral circuits for driving memory cells disposed in the cell array are disposed. The peripheral circuit region may be disposed around the cell array region.

The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined within the substrate 101 by the isolation layer 110. The active region ACT may have a bar shape and may be disposed in an island shape extending in one direction within the substrate 101. The one direction may be a direction inclined with respect to an extension direction of the word lines WL and bit lines BL. The active regions ACT may be arranged parallel to each other, and an end of one active region ACT may be disposed adjacent to the center of another active region ACT adjacent thereto.

The active region ACT may have first and second impurity regions 105a and 105b at a predetermined depth from the upper surface of the substrate 101. The first and second impurity regions 105a and 105b may be spaced apart from each other. The first and second impurity regions 105a and 105b may be provided as source/drain regions of a transistor formed by the word line WL. The source region and the drain region may be formed by first and second impurity regions 105a and 105b by doping or ion implantation of substantially the same impurities, and the names of the components may be interchanged depending on the circuit configuration of a finally formed transistor. The impurities may include dopants having conductivity opposite to that of the substrate 101. In example embodiments, the depths of the first and second impurity regions 105a and 105b in the source region and the drain region may be different.

The device isolation layer 110 may be formed by a shallow trench isolation (STI) process. The device isolation layer 110 may surround the active regions ACT and may electrically isolate from the regions. The device isolation layer 110 may be formed of an insulating material, such as, for example, silicon oxide, silicon nitride, or a combination thereof. The device isolation layer 110 may include a plurality of regions having different bottom depths depending on the width of the trench formed by etching the substrate 101.

The word line structures WLS may be disposed in the gate trenches 115 extending within the substrate 101. Each of the word line structures WLS may include a gate dielectric film 120, a word line WL, and a gate capping layer 125. In example embodiments, the "gate 120 WL" may be referred to as a structure including the gate dielectric film 120 and the word line WL, the word line WL may be referred to as a "gate electrode," and the word line structure WLS may be referred to as a "gate structure."

The word line WL may be disposed to extend in the first direction X across the active region ACT. For example, a pair of word lines WL adjacent to each other may be disposed to cross one of the active regions ACT. The word line WL may be included in a gate of a buried channel array transistor (BCAT). In example embodiments, the word lines WL may be disposed on the substrate 101. The word line WL may be disposed below the gate trench 115 to a predetermined thickness. The upper surface of the word line WL may be disposed on a level lower than a level of the upper surface of the substrate 101. In example embodiments, the "level" may be defined based on a substantially flat upper surface of the substrate 101.

The word line WL may include a conductive material, such as, for example, at least one of polycrystalline silicon (Si), titanium (Ti), titanium nitride (TiN), tantalum (Ta), tantalum nitride (TaN), tungsten (W), tungsten nitride (WN) and aluminum (Al). For example, the word line WL may include a lower pattern and an upper pattern formed of different materials, the lower pattern may include at least one of tungsten (W), titanium (Ti), tantalum (Ta), or tungsten nitride (WN), titanium nitride (TiN), and tantalum nitride (TaN), and the upper pattern may be a semiconductor pattern including polysilicon doped with P-type or N-type impurities.

The gate dielectric film 120 may be disposed on the bottom surface and inner surfaces of the gate trench 115. The gate dielectric film 120 may conformally cover inner walls of the gate trench 115. The gate dielectric film 120 may include at least one of silicon oxide, silicon nitride, and silicon oxynitride. The gate dielectric film 120 may be, for example, a silicon oxide layer or an insulating layer having a high dielectric constant. In example embodiments, the gate dielectric film 120 may be a layer formed by oxidizing the active region ACT or a layer formed by deposition.

The gate capping layer 125 may be disposed to fill the gate trench 115 above the word line WL. An upper surface of the gate capping layer 125 may be disposed on substantially the same level as a level of an upper surface of the substrate 101. The gate capping layer 125 may be formed of an insulating material such as silicon nitride.

The bit line structure BLS may extend in one direction perpendicular to the word line WL, that is, for example, in the second direction Y. The bit line structure BLS may include a bit line BL and a bit line capping pattern BC on the bit line BL.

The bit line BL may include a first conductive pattern 141, a second conductive pattern 142, and a third conductive pattern 143 stacked in order. The bit line capping pattern BC may be disposed on the third conductive pattern 143. A buffer insulating layer 128 may be disposed between the first conductive pattern 141 and the substrate 101, and a portion of the first conductive pattern 141 (hereinafter referred to as a bit line contact pattern DC) may be in contact with the first impurity region 105a of the active region ACT. The bit line BL may be electrically connected to the first impurity region 105a through the bit line contact pattern DC. The lower surface of the bit line contact pattern DC may be disposed on a level lower than a level of the upper surface of the substrate 101 and may be disposed on a level higher than a level of the upper surface of the word line WL. In example embodiments, the bit line contact pattern DC may be locally disposed in a bit line contact hole formed in the substrate 101 to expose the first impurity region 105a.

The first conductive pattern 141 may include a semiconductor material such as polycrystalline silicon. The first conductive pattern 141 may be in direct contact with the first impurity region 105a. The second conductive pattern 142 may include a metal-semiconductor compound. The metal-semiconductor compound may be, for example, a layer in which a portion of the first conductive pattern 141 is silicidated. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), or aluminum (Al). The number of conductive patterns included in the bit line BL, the type of material, and/or the stacking order may be varied in example embodiments.

The bit line capping pattern BC may include a first capping pattern 146, a second capping pattern 147, and a third capping pattern 148 stacked in order on the third conductive pattern 143. Each of the first to third capping patterns 146, 147, and 148 may include an insulating material, such as, for example, a silicon nitride layer. The first to third capping patterns 146, 147, and 148 may be formed of different materials, and even when the patterns include the same material, a boundary may be a due to difference in physical properties. A thickness of the second capping pattern 147 may be smaller than a thickness of the first capping pattern 146 and a thickness of the third capping pattern 148. The number of capping patterns included in the bit line capping pattern BC and/or the type of material may be varied in example embodiments.

The spacer structures SS may be disposed on both sidewalls of each of the bit line structures BLS and may extend in one direction, that is, for example, the Y-direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on both sides of one bit line structure BLS may have an asymmetrical shape with respect to the bit line structure BLS. Each of the spacer structures SS may include a plurality of spacer layers, and may further include an air spacer in example embodiments.

The lower conductive pattern 150 may be connected to one region of the active region ACT, that is, for example, the second impurity region 105b. The lower conductive pattern 150 may be disposed between the bit lines BL and between the word lines WL. The lower conductive pattern 150 may penetrate through the buffer insulating layer 128 and may be connected to the second impurity region 105b of the active region ACT. The lower conductive pattern 150 may be in direct contact with the second impurity region 105b. The lower surface of the lower conductive pattern 150 may be disposed on a level lower than a level of the upper surface of the substrate 101 and may be disposed on a level higher than a level of the lower surface of the bit line contact pattern DC. The lower conductive pattern 150 may be insulated from the bit line contact pattern DC by the spacer structure SS. The lower conductive pattern 150 may be formed of a conductive material, such as, for example, polycrystalline silicon (Si), titanium (Ti), titanium nitride (TiN), tantalum (Ta), tantalum nitride (TaN), tungsten (W), tungsten nitride (WN), and aluminum (Al). In example embodiments, the lower conductive pattern 150 may include a plurality of layers.

A metal-semiconductor compound layer 155 may be disposed between the lower conductive pattern 150 and the upper conductive pattern 160. The metal-semiconductor compound layer 155 may be, for example, a layer obtained by silicidizing a portion of the lower conductive pattern 150 when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In example embodiments, the metal-semiconductor compound layer 155 may not be provided.

The upper conductive pattern 160 may be disposed on the lower conductive pattern 150. The upper conductive pattern 160 may extend to a region between the spacer structures SS and may cover the upper surface of the metal-semiconductor compound layer 155. The upper conductive pattern 160 may include a barrier layer 162 and a conductive layer 164. The barrier layer 162 may cover the lower surface and side surfaces of the conductive layer 164. The barrier layer 162 may include metal nitride, such as, for example, at least one of titanium nitride (TiN), tantalum nitride (TaN), and tungsten nitride (WN). The conductive layer 164 may include a conductive material such as, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The insulating patterns 165 may be disposed to penetrate through the upper conductive pattern 160. The upper conductive pattern 160 may be divided into a plurality of insulating patterns 165. The insulating patterns 165 may include an insulating material, such as, for example, at least one of silicon oxide, silicon nitride, and silicon oxynitride.

The etch stop layer 168 may cover the insulating patterns 165 between the lower electrodes 170. The etch stop layer 168 may be in contact with lower regions of side surfaces of the lower electrode 170. The etch stop layer 168 may be disposed below the support layers 171 and 172. An upper surface of the etch stop layer 168 may include a portion exposed from the first interfacial layer 175 and in direct contact with the dielectric structure 180. The etch stop layer 168 may include, for example, at least one of silicon nitride and silicon oxynitride.

The capacitor structure CAP may include a lower electrode 170, support layers 171 and 172, a dielectric structure 180, and an upper electrode 190.

The lower electrode 170 may be disposed on the upper conductive patterns 160. The lower electrode 170 may penetrate through the etch stop layer 168 and may be in contact the upper conductive patterns 160. The lower electrode 170 may have a cylindrical shape or a hollow cylinder or a cup shape. At least one or more support layers 171 and 172 supporting the lower electrode 170 may be provided between adjacent lower electrodes 170. The lower electrode 170 may include at least one of polycrystalline silicon (Si), titanium (Ti), titanium nitride (TiN), tantalum (Ta), tantalum nitride (TaN), tungsten (W), tungsten nitride (WN), and aluminum (Al).

The support layers 171 and 172 may include a first support layer 171 and a second support layer 172 on the first support layer 171. The support layers 171 and 172 may be in contact with the lower electrode 170 and may extend in a direction parallel to the upper surface of the substrate 101. Each of the upper and lower surfaces of the support layers 171 and 172 may include a region spaced apart from the first interface film 175. For example, each of the upper and lower surfaces of the support layers 171 and 172 may include a portion exposed from the first interface film 175 and in direct contact with the dielectric structure 180. The second support layer 172 may have a thickness greater than that of the first support layer 171. The support layers 171 and 172 may be layers supporting the lower electrode 170 having a high aspect ratio. Each of the support layers 171 and 172 may include, for example, at least one of silicon nitride and silicon oxynitride, or a material similar thereto. The number, thickness, and/or arrangement relationship of the support layers 171 and 172 are not limited to illustrated examples and may be varied in example embodiments.

The dielectric structure 180 may cover the etch stop layer 168, the lower electrode 170, and the support layers 171 and 172. The dielectric structure 180 may conformally cover the upper and side surfaces of the lower electrode 170, the upper surface of the etch stop layer 168, and the exposed surfaces of the support layers 171 and 172. The dielectric structure 180 may extend to a region between the upper electrode 190 and the support layers 171 and 172. In example embodiments, upper and lower surfaces of each of the support layers 171 and 172 may be in contact with the dielectric structure 180. The dielectric structure 180 may extend to a region between the upper electrode 190 and the etch stop layer 168. In example embodiments, an upper surface of the etch stop layer 168 may be in contact with the dielectric structure 180. The dielectric structure 180 may include a high-k material, silicon oxide, silicon nitride, silicon oxynitride, or a combination thereof. In example embodiments, the dielectric structure 180 may include an oxide, nitride, silicide, oxynitride, or silicic acid including one of hafnium (Hf), aluminum (Al), zirconium (Zr), and lanthanum (La).

In the shown example embodiment, the dielectric structure 180 may include a first dielectric film 181 including a first material and a second dielectric film 182 including a second material different from the first material. Each of the first and second dielectric films 181 and 182 may include a material having a dielectric constant of 10 or more. For example, each of the first and second dielectric films 181 and 182 may include zirconium oxide, hafnium oxide, niobium oxide, yttrium oxide, silicon oxide, tantalum oxide, and/or aluminum oxide. Each of the first and second dielectric films 181 and 182 may include a material having a tetragonal crystal phase. For example, the first dielectric film 181 may include zirconium oxide having a tetragonal crystal phase, and the second dielectric film 182 may include hafnium oxide having a tetragonal crystal phase. In example embodiments, the first dielectric film 181 may further include zirconium oxide having a cubic crystal phase, and the second dielectric film 182 may further include hafnium oxide having a cubic crystal phase.

The dielectric constant of zirconium oxide having a tetragonal crystal phase may be 47, and the dielectric constant of hafnium oxide having a tetragonal crystal phase may be 70. To increase the dielectric constant of the dielectric structure 180, the ratio of the amount of hafnium oxide having a tetragonal crystalline phase to the amount of zirconium oxide having a tetragonal crystal phase may be increased. However, crystallization of hafnium oxide may be relatively more difficult to achieve than crystallization of zirconium oxide. To provide more crystallization of hafnium oxide, the contact area of hafnium oxide to crystallized zirconium oxide may be increased. To increase the contact area of hafnium oxide to the crystallized zirconium oxide, hafnium oxide may be disposed within the grain boundaries of the zirconium oxide. Accordingly, hafnium oxide may be crystallized to have the same crystal structure as that of the crystallized zirconium oxide. In the example embodiment, the first dielectric film 181 may have openings OP each extending toward the lower electrode 170 and the upper electrode 190. A side surface of an opening OP may have a curved shape having an inwardly curved region, curved toward the interior of the opening OP and an outwardly curved region, curved toward the exterior of the opening OP. To achieve desirable crystallization of the second dielectric film 182, at least a portion of the second dielectric film 182 may be disposed within the opening OP of the first dielectric film 181. At least a portion of the second dielectric film 182 may fill the openings OP and thereby "penetrate through" the first dielectric film 181; may extend toward the lower electrode 170 and the upper electrode 190; and may be in contact with the lower electrode 170 and/or the upper electrode 190. (In FIG. 3, it contacts only the lower electrode 170.) A region in which the second dielectric film 182 is disposed within the opening OP of the first dielectric film 181 may be referred to as a mixed material layer ("mixed layer") ML. In the mixed layer ML, a first dielectric film 181 and a second dielectric film 182 may be alternately stacked in a direction (the Y direction) parallel to a surface in which the dielectric structure 180 and the upper electrode 190 are in contact with each other. The dielectric structure 180 may further include single material layers ("single layers") SL1 and SL2 disposed externally of the mixed layer ML and generally including the first material or the second material (in the example of FIG. 3, single layers SL1 and SL2 are composed only of the first material and the second material, respectively, as illustrated). At least a portion of the single layers SL1 and SL2 may be integrated with and connected to the mixed layer ML. In FIG. 3, the first single layer SL1 is designated with legends 188 and 182a, respectively, which may be used interchangeably with SL1 and SL2 for clarity of description.

In the embodiment of FIG. 3, the dielectric structure 180 may include the first dielectric film 181, the second dielectric film 182, the second single layer 182a (an upper portion of the second dielectric film 182), and the first single layer 188. The second dielectric film 182 may include the single layer 182a, "legs" 182b and 182c, a lower surface 182d and an upper surface 182e.

The first dielectric film 181 may include a first surface 181a in contact with or facing the lower electrode 170 and a second surface 181b opposite to the first surface 181a. The second dielectric film 182 may include a first portion, e.g., leg 182c and/or leg 182b, extending in a direction from the second surface 181b toward the first surface 181a (e.g., generally along an axis perpendicular to each of the first surface 181a and the second surface 181b). The second dielectric film 182 may have its lower surface 182d (at the lower end of leg 182c or 182b) in contact with or facing the lower electrode 170, an upper surface 182e opposite to the lower surface 182d, and a side surface (of legs 182c/182b), where the side surface may be in contact with the first dielectric film 181. At least a portion of the side surface may have a curved shape having an outwardly curved region and an inwardly curved region.

A thickness h3 of the combined single layers SL1 and SL2 of the dielectric structure 180 may be about 5 nm to about 50 nm. A thickness h2 of the mixed layer ML may be greater than the thickness h3 of the single layer SL. A width w2 of the second dielectric film in the mixed layer may be smaller than a width w1 of the first dielectric film in the mixed layer. A width w2 of the second dielectric film in the mixed layer may be about 1 nm to about 10 nm.

The upper electrode 190 may be configured to surround the lower electrode 170, at least one of the support layers 171 and 172, and the dielectric structure 180. The upper electrode 190 may be configured to fill a space between the lower electrodes 170 and a space between the at least one support layer 171 and 172.

The upper electrode 190 may include a conductive material. The conductive material may include a semiconductor material such as polycrystalline silicon doped with impurities, a metal nitride such as titanium nitride (TiN), and a metal material such as titanium (Ti), cobalt (Co), nickel (Ni), tungsten (W), and molybdenum (Mo).

FIGS. 4, 5, 6, 7, 8 and 9 are each a cross-sectional view of a portion of a semiconductor device 100a, 100b, 100c, 100d, 100e and 100f, respectively, each of which is another example of the semiconductor device 100. The views of FIGS. 4-9 each depict an enlarged view of region "A" of the semiconductor device 100 of FIG. 2, and each illustrates an alternative example structure to that of FIG. 3. Thus, FIGS. 4-9 each depict an example structure of a region between first and second electrodes of a capacitor of the semiconductor device 100.

Figure 4:
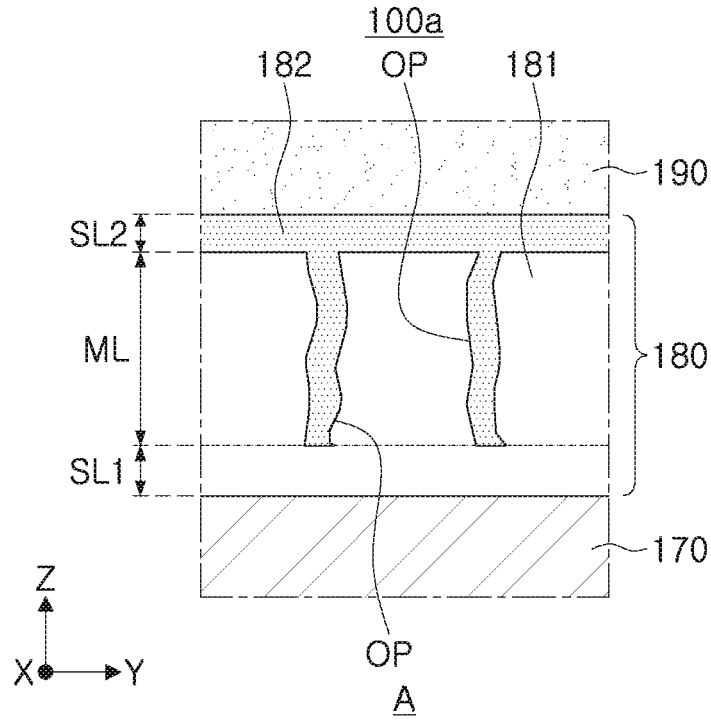
FIG. 4 is a cross-sectional view illustrating another example structure of the region "A" of the semiconductor device of FIG. 2.

Referring to FIG. 4, a difference from the example embodiment in FIGS. 1 to 3 is that the first single layer SL1 may not be disposed on the second single layer SL2, and may be disposed below the mixed layer ML. Further, the first single layer SL1 may be in contact with the lower electrode 170 and the second single layer SL2 may be in contact with the upper electrode 190.

Figure 5:
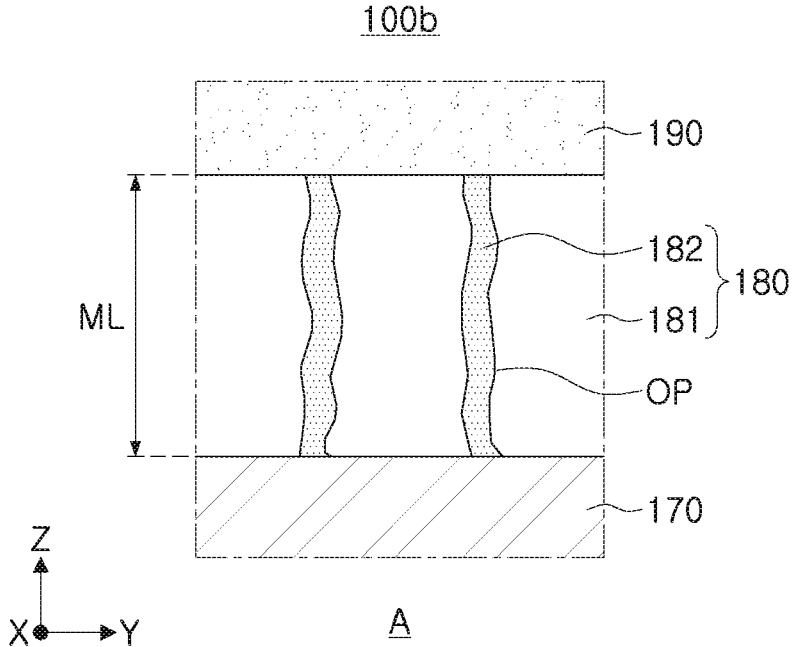
FIG. 5 is a cross-sectional view illustrating yet another example structure of the region "A" of the semiconductor device of FIG. 2.

Referring to FIG. 5, a difference from the example embodiment in FIGS. 1 to 3 is that the dielectric structure 180 may not include single layers SL1 and SL2, and may include only a mixed layer ML. Further, in the mixed layer ML, the first dielectric film 181 and the second dielectric film 182 may be in contact with the lower electrode 170 and the upper electrode 190, respectively.

Figure 6:
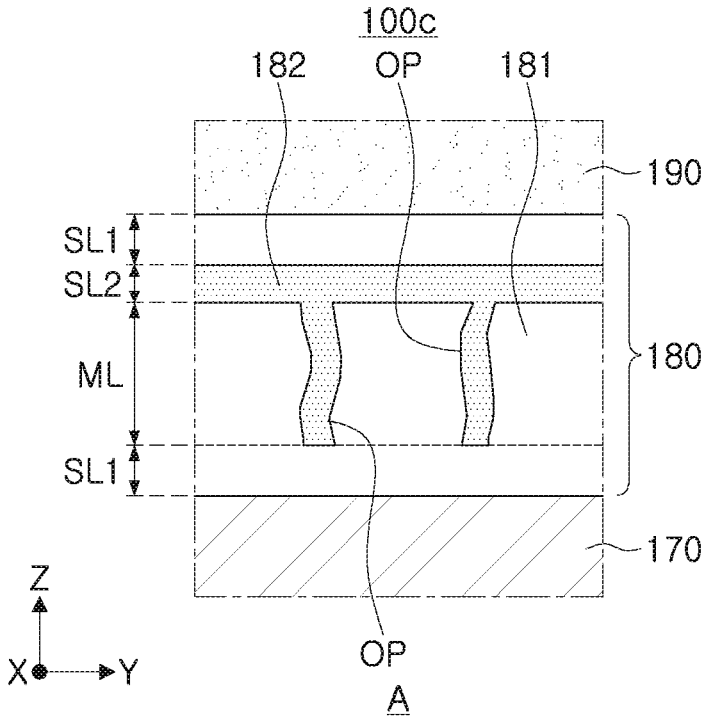
FIG. 6 is a cross-sectional view illustrating still another example structure of the region "A" of the semiconductor device of FIG. 2.

Referring to FIG. 6, in contrast to the example embodiment in FIGS. 1 to 3, a first single layer SL1 may be further disposed below the mixed layer ML. Additionally, the first single layer SL1 may be in contact with the lower electrode 170 and the upper electrode 190.

Figure 7:
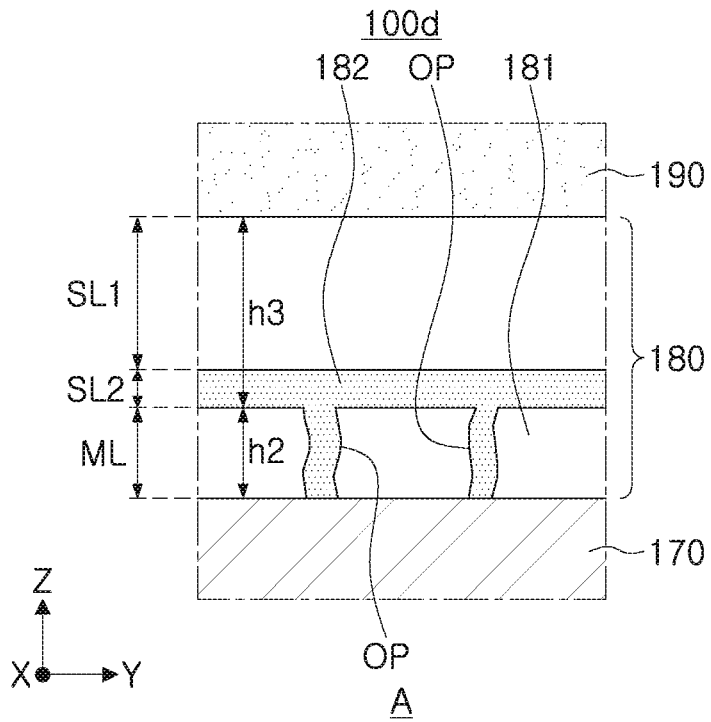
FIG. 7 is a cross-sectional view illustrating another example structure of the region "A" of the semiconductor device of FIG. 2.

Referring to FIG. 7, in contrast to the example embodiment in FIGS. 1 to 3, the thickness h2 of the mixed layer ML may be smaller than the thickness h3 of the single layer SL.

Figure 8:
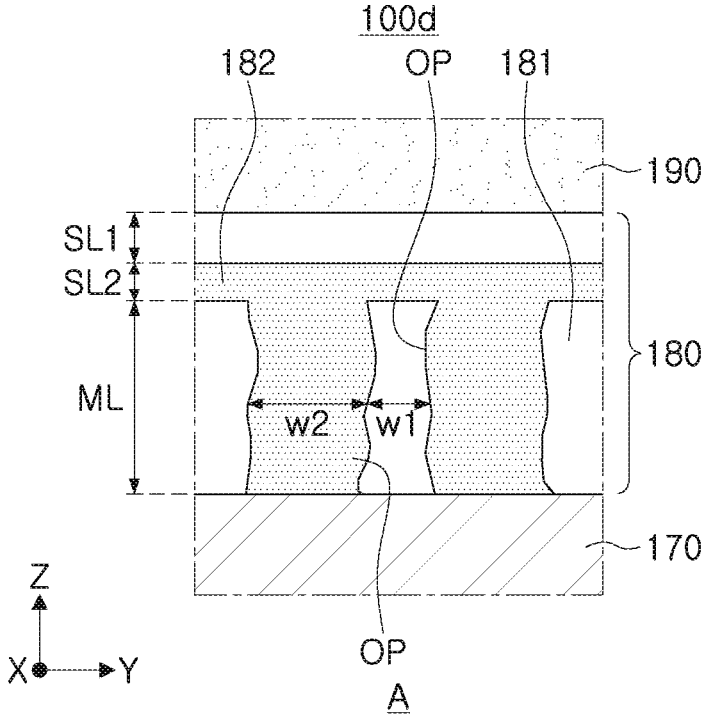
FIG. 8 is an enlarged cross-sectional view illustrating another example structure of the region "A" of the semiconductor device of FIG. 2.

Referring to FIG. 8, in contrast to the example embodiments in FIGS. 1 to 3, the width w2 of the second dielectric film 182 in the mixed layer ML may be greater than the width w1 of the first dielectric film 181 in the mixed layer ML. In a portion of stages of the process of manufacturing the semiconductor device 100e, an etching process may be performed to form the opening OP of the mixed layer ML. As the etching process is performed, the width w2 of the second dielectric film 182 in the mixed layer ML may increase.

Figure 9:
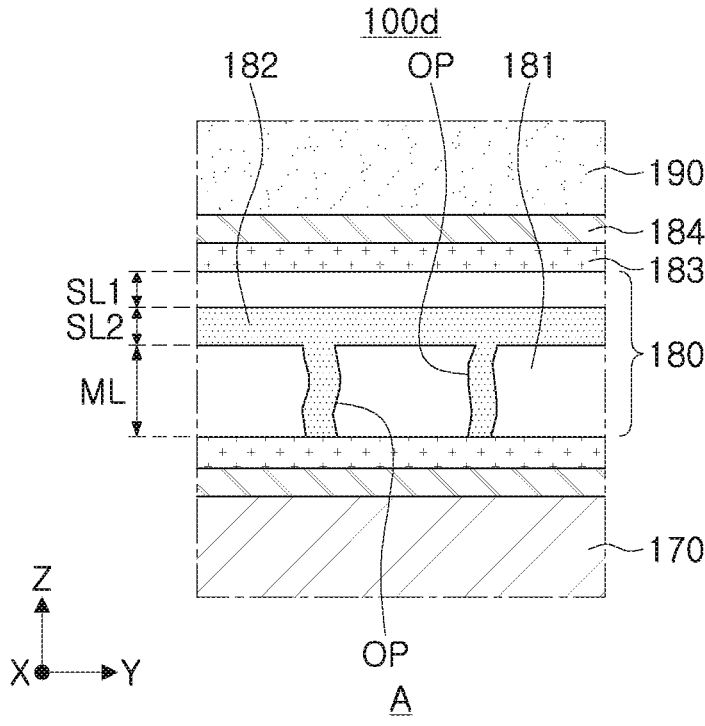
FIG. 9 is an enlarged cross-sectional view illustrating another example structure of the region "A" of the semiconductor device of FIG. 2.

Referring to FIG. 9, the capacitor structure CAP may further include interfacial layers 183 and 184 disposed externally of the dielectric structure 180 and including a third material different from the first and second materials. The interfacial layers 183 and 184 may be structures for improving capacitance of the capacitor structure CAP. The interfacial layers 183 and 184 may include a first interfacial layer 183 and a second interfacial layer 184 including different materials. In example embodiments, the number of layers included in the interfacial layers 183 and 184 may be varied. The interfacial layers 183 and 184 may include at least one of tin (Sn), molybdenum (Mo), niobium (Nb), tantalum (Ta), titanium (Ti), indium (In), nickel (Ni), and cobalt (Co), tungsten (W), and ruthenium (Ru).

FIGS. 10A to 10D are diagrams illustrating a method of manufacturing a semiconductor device according to an example embodiment.

Figure 10A:
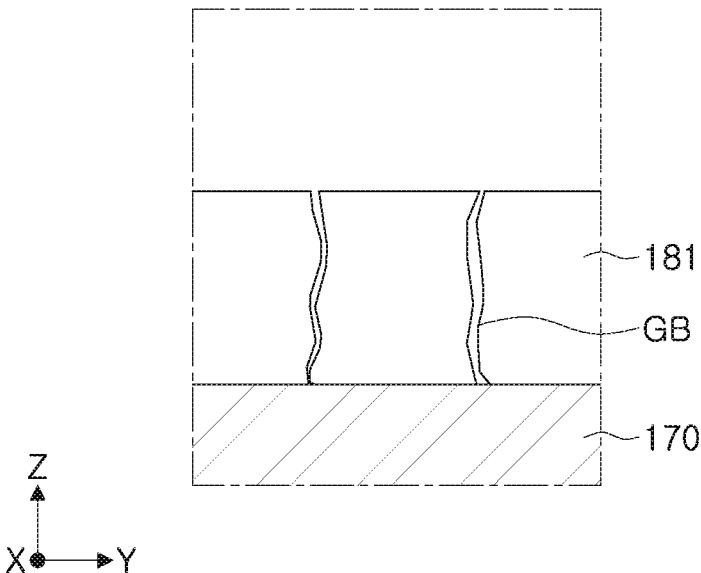
FIGS. 10A, 10B, 10C and 10D are diagrams illustrating a method of manufacturing a semiconductor device according to an example embodiment of the present disclosure.

Referring to FIG. 10A, a first dielectric film 181 having a first material may be deposited on the lower electrode 170. The first dielectric film 181 may be deposited using atomic layer deposition (ALD) or chemical vapor deposition (CVD). The lower electrode 170 may have a columnar grain. When the first dielectric film 181 is deposited on the lower electrode 170 having columnar grains, the first dielectric film 181 may also have columnar grains as the lower electrode 170. A boundary between columnar grains of the first dielectric film 181 may be defined as a grain boundary GB. The grain boundary GB may extend toward the lower electrode 170.

Figure 10B:
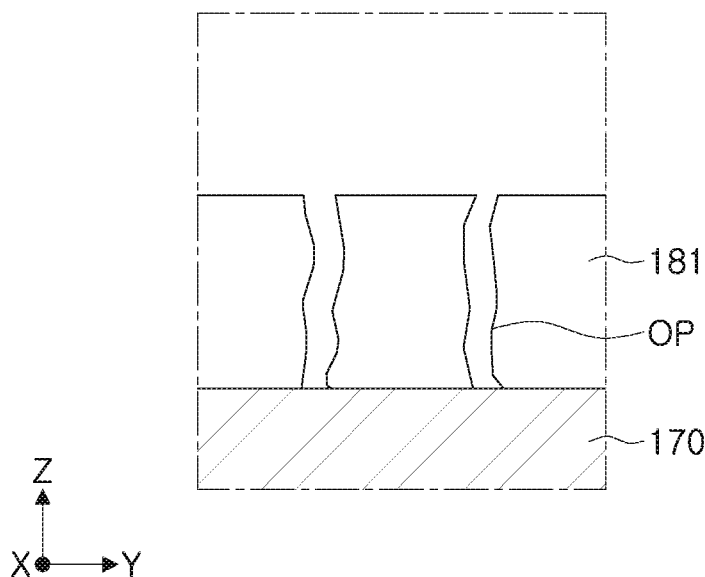

Referring to FIG. 10B, the grain boundary GB may be etched. The grain boundary GB of the first dielectric film 181 may be selectively etched using an atomic layer etch method. In example embodiments, the grain boundary GB of the first dielectric film 181 may be selectively etched using a supercritical fluid etch method or a liquid etch method. The opening OP discussed earlier may correspond to a region in which the grain boundary GB is etched.

Figure 10C:
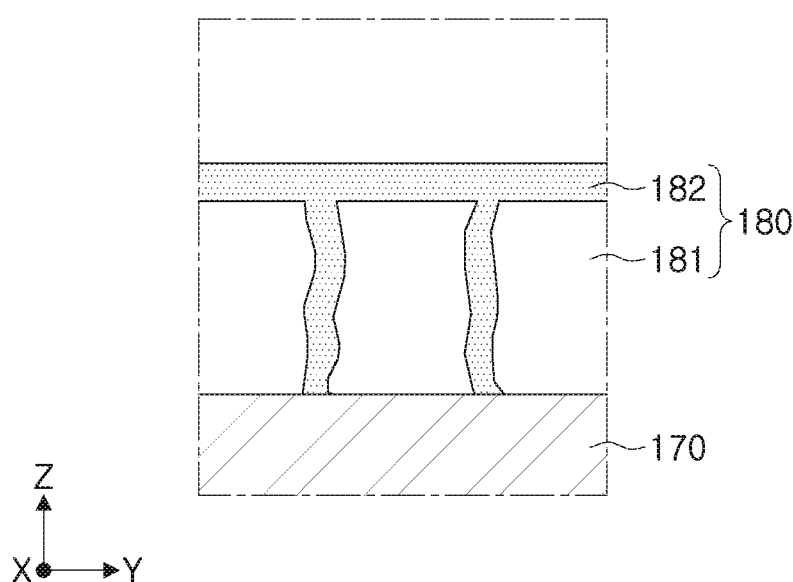

Referring to FIG. 10C, a second dielectric film 182 including a second material different from the first material may be deposited. The second dielectric film 182 may be deposited using atomic layer deposition (ALD) or chemical vapor deposition (CVD). The second dielectric film 182 may fill the opening OP and may cover the opening OP and the first dielectric film 181.

Figure 10D:
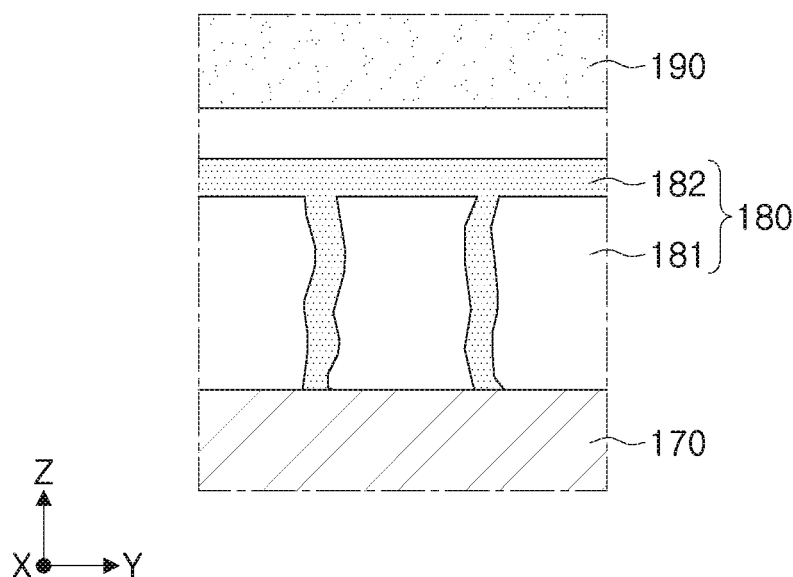

Referring to FIG. 10D, a first dielectric film 181 including the first material may be deposited on the second dielectric film 182. The first dielectric film 181 may be deposited using atomic layer deposition (ALD) or chemical vapor deposition (CVD). Thereafter, an upper electrode 190 may be formed on the first dielectric film 181.

Accordingly, the capacitor structure CAP in FIGS. 1 to 3 may be manufactured.

Figure 11:
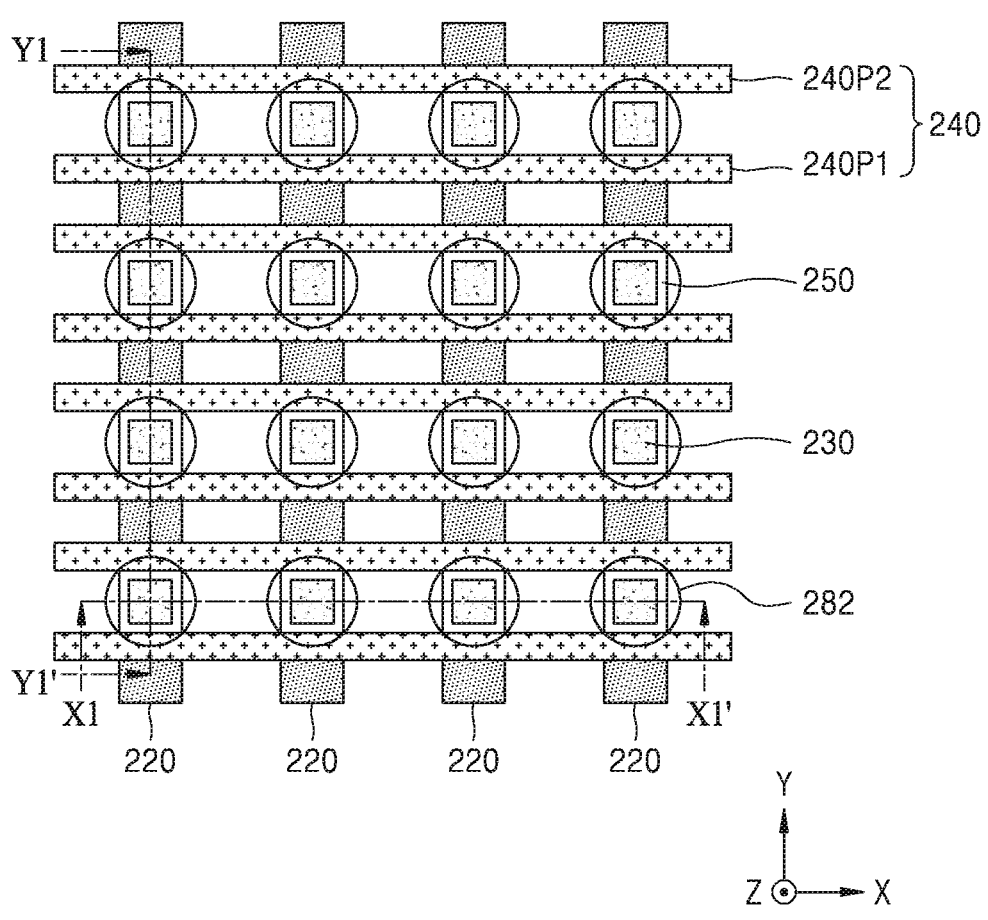
FIG. 11 is a layout view illustrating an integrated circuit device according to an example embodiment of the present disclosure.

FIG. 11 is a layout illustrating an integrated circuit device according to an example embodiment.

Figure 12:
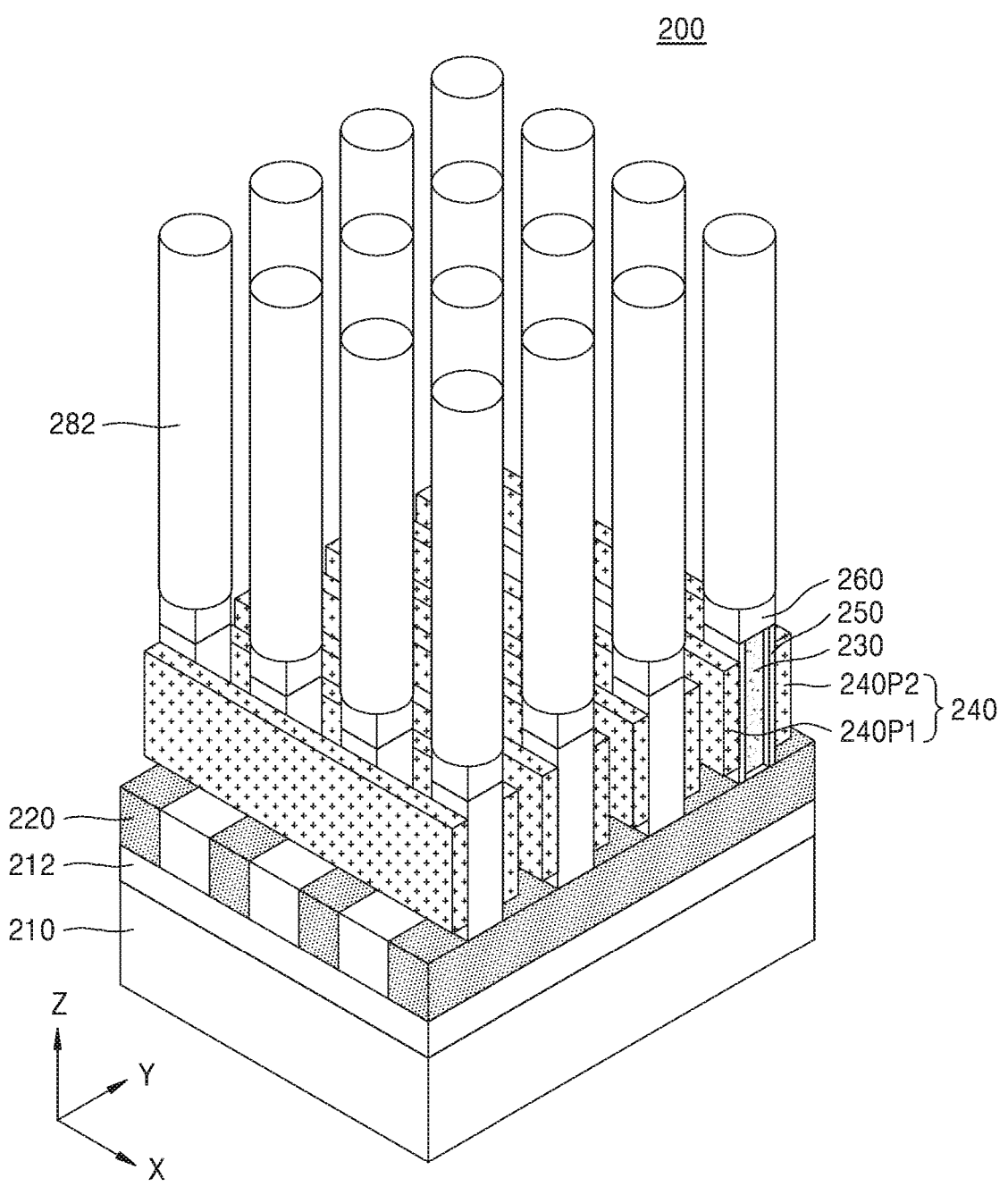
FIG. 12 is a perspective view illustrating an integrated circuit device according to an example embodiment of the present disclosure.

FIG. 12 is a perspective view illustrating an integrated circuit device according to an example embodiment.

Figure 13:
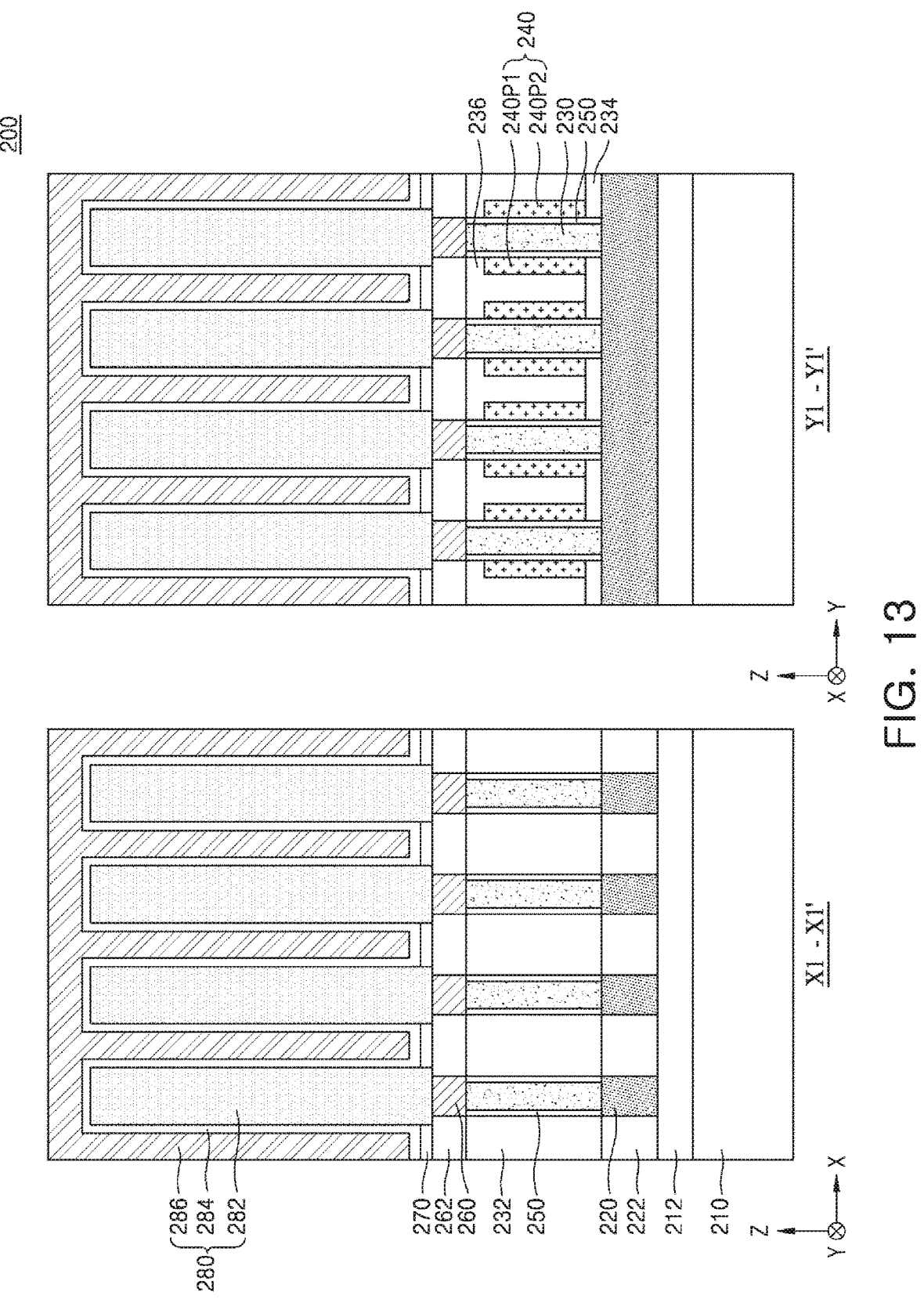
FIG. 13 is a cross-sectional view illustrating an integrated circuit device according to an example embodiment of the present disclosure.

FIG. 13 is a cross-sectional view illustrating an integrated circuit device according to an example embodiment.

Referring to FIGS. 11 to 13, the integrated circuit device 200 may include a substrate 210, a plurality of first conductive lines 220, a channel layer 230, a gate electrode 240, a gate insulating layer 250, and a data storage structure 280. The integrated circuit device 200 may be implemented as a memory device including a vertical channel transistor (VCT). The vertical channel transistor may refer to a structure in which a channel length of the channel layer 230 may extend from the substrate 210 in a vertical direction.

A lower insulating layer 212 may be disposed on substrate 210, and a plurality of first conductive lines 220 on the lower insulating layer 212 may be spaced apart from each other in a first direction (X-direction) and may extend in the second direction (Y-direction). A plurality of first insulating patterns 222 may be disposed on the lower insulating layer 212 to fill spaces between each of the plurality of first conductive lines 220. The plurality of first insulating patterns 222 may extend in the second direction (Y-direction), and upper surfaces of the plurality of first insulating patterns 222 may be disposed on the same level as a level of upper surfaces of the plurality of first conductive lines 220. The plurality of first conductive lines 220 may function as bit lines of the integrated circuit device 200.

In example embodiments, the plurality of first conductive lines 220 may include doped polysilicon, metal, conductive metal nitride, conductive metal silicide, conductive metal oxide, or a combination thereof. For example, the plurality of first conductive lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The plurality of first conductive lines 220 may include a single layer or multiple layers of the aforementioned materials. In example embodiments, the plurality of first conductive lines 220 may include a 2D semiconductor material, and for example, the 2D semiconductor material may include graphene, carbon nanotube, or a combination thereof.

The channel layer 230 may be arranged in a matrix form in which the channel layers 230 may be spaced apart from each other in the first direction (X-direction) and the second direction (Y-direction) on the plurality of first conductive lines 220. The channel layer 230 may have a first width in the first direction (X-direction) and a first height in a third direction (Z-direction), and the first height may be greater than the first width. For example, the first height may be about 2 to 10 times the first width. The bottom portion of the channel layer 230 may function as a first source/drain region (not illustrated), the upper portion of the channel layer 230 may function as a second source/drain region (not illustrated), and a portion of the channel layer 230 between first and second source/drain regions may function as a channel region (not illustrated).

In example embodiments, the channel layer 230 may include an oxide semiconductor, and for example, the oxide semiconductor may include InxGayZnzO, InxGaySizO, InxSnyZnzO, InxZnyO, ZnxO, ZnxSnyO, ZnxOyN, ZrxZnySnzO, SnxO, HfxlnyZnzO, GaxZnySnzO, AlxZnySnzO, YbxGayZnzO, InxGayO, or combinations thereof. The channel layer 230 may include a single layer or multiple layers of the oxide semiconductor. In example embodiments, the channel layer 230 may have a bandgap energy greater than that of silicon. For example, the channel layer 230 may have a bandgap energy of about 1.5 eV to about 5.6 eV. For example, the channel layer 230 may have optimal channel performance when it has a bandgap energy of about 2.0 eV to about 4.0 eV. For example, the channel layer 230 may be polycrystalline or amorphous. In example embodiments, the channel layer 230 may include a 2D semiconductor material, and for example, the 2D semiconductor material may include graphene, carbon nanotubes, or a combination thereof.

The gate electrode 240 may extend in a first direction (X-direction) on both sidewalls of the channel layer 230. The gate electrode 240 may include a first sub-gate electrode 240P1 facing the first sidewall of the channel layer 230 and a second sub-gate electrode 240P2 facing the second sidewall opposite the first sidewall of the channel layer 230. As one channel layer 230 is disposed between the first sub-gate electrode 240P1 and the second sub-gate electrode 240P2, the integrated circuit device 200 may have a dual-gate transistor structure. However, embodiments are not limited thereto. For instance, the second sub-gate electrode 240P2 may not be provided and only the first sub-gate electrode 240P1 facing the first sidewall of the channel layer 230 may be formed, thereby implementing a single gate transistor structure.

The gate electrode 240 may include doped polysilicon, a metal, a conductive metal nitride, a conductive metal silicide, a conductive metal oxide, or a combination thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments are not limited thereto.

The gate insulating layer 250 may surround sidewalls of the channel layer 230 and may be interposed between the channel layer 230 and the gate electrode 240. For example, as illustrated in FIG. 13, the entire sidewall of the channel layer 230 may be surrounded by the gate insulating layer 250, and a portion of the sidewall of the gate electrode 240 may be in contact with the gate insulating layer 250. In other embodiments, the gate insulating layer 250 may extend in the extension direction of the gate electrode 240 (the first direction (X-direction)), and only two sidewalls facing the gate electrode 240 among the sidewalls of the channel layer 230 may be in contact with the gate insulating layer 250.

In example embodiments, the gate insulating layer 250 may be formed of a silicon oxide layer, a silicon oxynitride layer, a high-k dielectric film having a higher dielectric constant than the silicon oxide layer, or a combination thereof. The high dielectric film may be formed of metal oxide or metal oxynitride. For example, the high-k film used as the gate insulating layer 250 may be formed of HfO2, HfSiO, HfSiON, HfTaO, HfSiO, HfZrO, ZrO2, Al2O3, or a combination thereof, but embodiments are not limited thereto.

A plurality of second insulating patterns 232 may extend in the second direction (Y-direction) on the plurality of first insulating patterns 222, and a channel layer 230 may be disposed between two second insulating patterns 232 adjacent to each other among the plurality of second insulating patterns 232. Also, a first filling layer 234 and a second filling layer 236 may be disposed in a space between two second insulating patterns 232 adjacent to each other between two channel layers 230 adjacent to each other. The first filling layer 234 may be disposed on the bottom of the space between the two adjacent channel layers 230, and the second filling layer 236 may be formed to fill the other region of the space between two channel layers 230 adjacent to each other on the first filling layer 234. An upper surface of the second filling layer 236 may be disposed on the same level as a level of an upper surface of the channel layer 230, and the second filling layer 236 may cover an upper surface of the gate electrode 240. Alternatively, the plurality of second insulating patterns 232 may be formed as a material layer connected to the plurality of first insulating patterns 222, or the second filling layer 236 may be formed as a material layer connected to the first filling layer 234.

A storage contact 260 may be disposed on the channel layer 230. The storage contacts 260 may be disposed to vertically overlap the channel layer 230 and may be arranged in a matrix form to be spaced apart from each other in a first direction (X-direction) and a second direction (Y-direction). The storage contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The upper insulating layer 262 may surround sidewalls of the storage contact 260 on the plurality of second insulating patterns 232 and the second filling layer 236.

An etch stop layer 270 may be disposed on the upper insulating layer 262, and a data storage structure 280 may be disposed on the etch stop layer 270. The data storage structure 280 may include a lower electrode 282, a dielectric structure 284, and an upper electrode 286.

The lower electrode 282 may penetrate through the etch stop layer 270 and may be electrically connected to an upper surface of the storage contact 260. The lower electrode 282 may be formed in a pillar type extending in the third direction (Z-direction). In example embodiments, the lower electrode 282 may be disposed to vertically overlap the storage contact 260 and may be arranged in a matrix form to be spaced apart from each other in the first direction (X-direction) and the second direction (Y-direction). Alternatively, a landing pad (not illustrated) may be further disposed between the storage contact 260 and the lower electrode 282 such that the lower electrode 282 may be arranged in a hexagonal shape.

In the integrated circuit device 200, the dielectric structure 284 of the data storage structure 280 may include a mixed layer in which a second material different from the first material is disposed in an opening of the first material. Any of the same or similar example dielectric structures 180 described above may be used for the dielectric structure 284.

Figure 14:
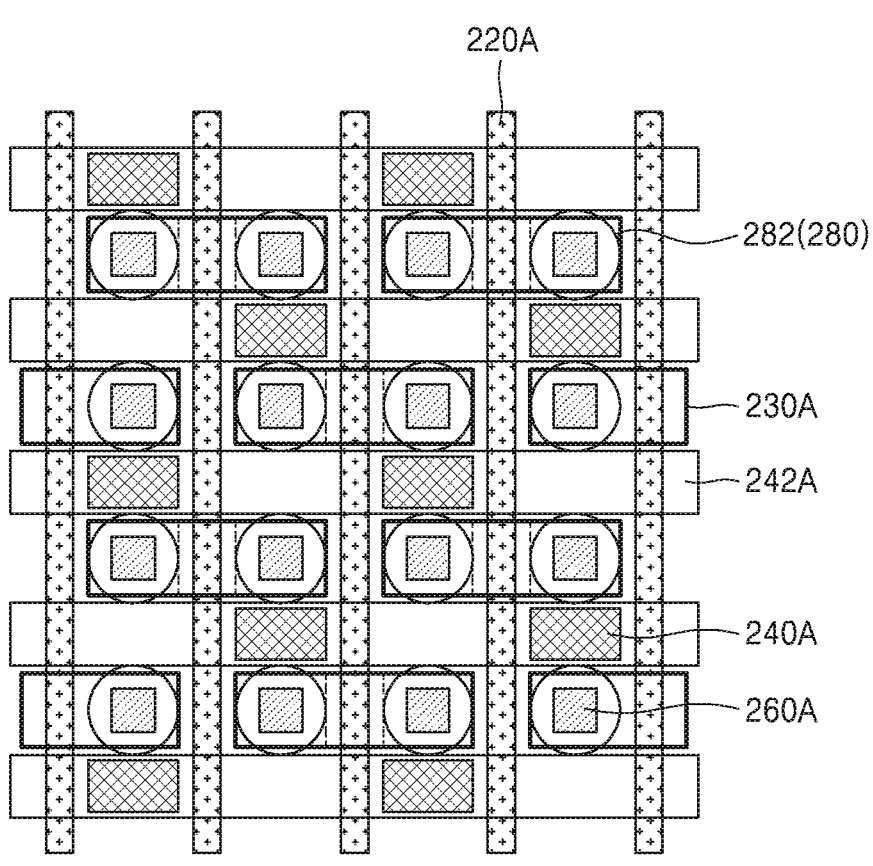
FIG. 14 is a layout view illustrating an integrated circuit device according to an example embodiment of the present disclosure.

FIG. 14 is an example layout illustrating an integrated circuit device according to an example embodiment.

Figure 15:
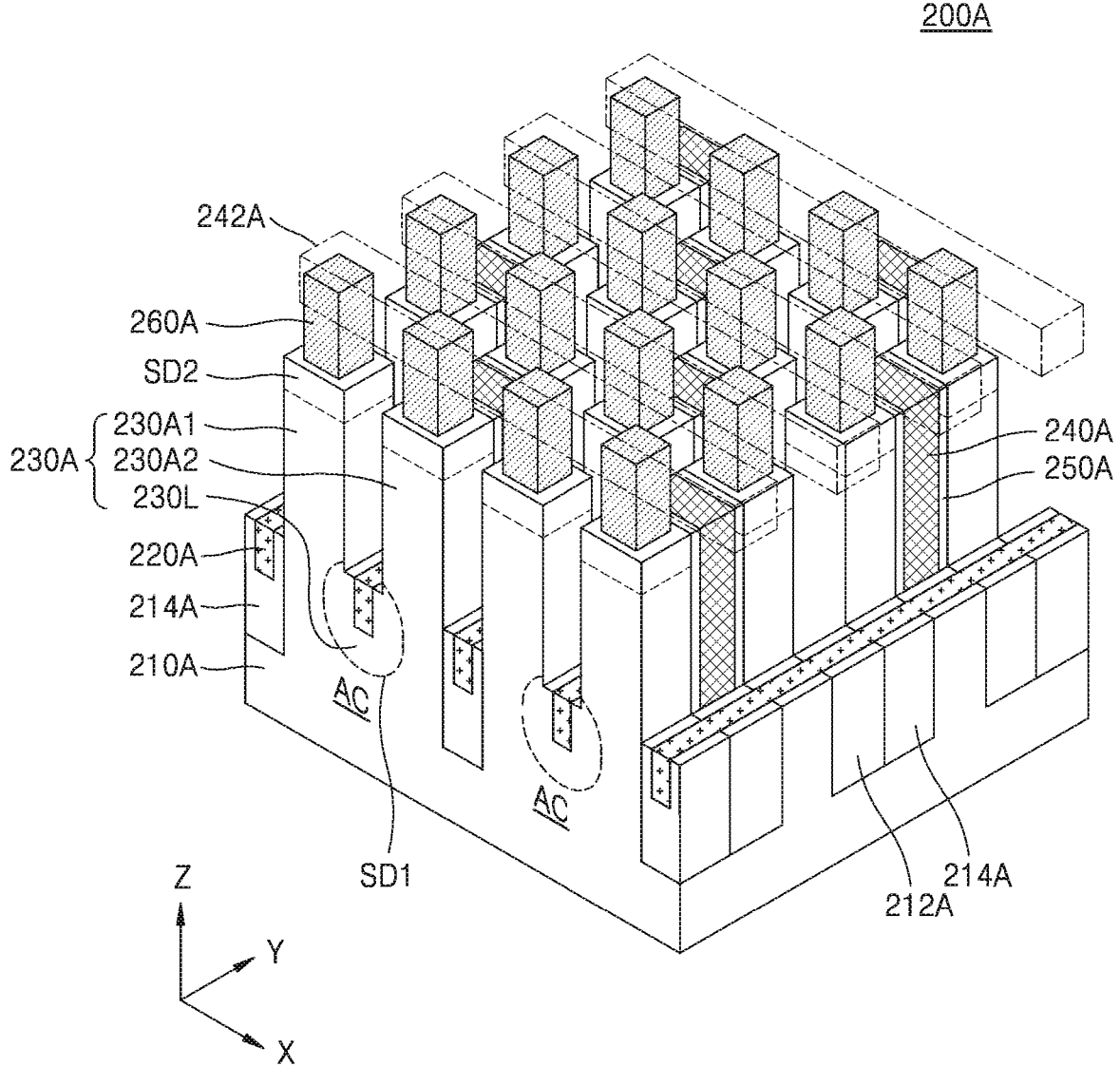
FIG. 15 is a perspective view illustrating an integrated circuit device according to an example embodiment of the present disclosure.

FIG. 15 is a perspective view illustrating an integrated circuit device according to an example embodiment.

Referring to FIGS. 14 and 15, the integrated circuit device 200A may include a substrate 210A, a plurality of first conductive lines 220A, a channel structure 230A, a contact gate electrode 240A, a plurality of second conductive lines 242A, and a data storage structure 280. The integrated circuit device 200A may be implemented as a memory device including a vertical channel transistor (VCT).

A plurality of active regions AC may be defined on the substrate 210A by the first device isolation layer 212A and the second device isolation layer 214A. The channel structure 230A may be disposed in each active region AC, and the channel structure 230A may include first and second active pillars 230A1 and 230A2 extending in a vertical direction, and a connection portion 230L connected to the bottom portion of the first active pillar 230A1 and the bottom portion of the second active pillar 230A2. A first source/drain region SD1 may be disposed within the connection portion 230L, and a second source/drain region SD2 may be disposed above the first and second active pillars 230A1 and 230A2. Each of the first active pillar 230A1 and the second active pillar 230A2 may form an independent unit memory cell.

The plurality of first conductive lines 220A may extend in a direction intersecting each of the plurality of active regions AC, and may extend in a second direction (Y-direction), for example. Among the plurality of first conductive lines 220A, the first conductive line 220A may be disposed on the connection portion 230L between the first active pillar 230A1 and the second active pillar 230A2, and the first conductive line 220A of may be disposed on the first source/drain region SD1. Another first conductive line 220A adjacent to the one first conductive line 220A may be disposed between the two channel structures 230A. Among the plurality of first conductive lines 220A, the first conductive line 220A may function as a common bit line included in two unit memory cells formed by the first active pillar 230A1 and the second active pillar 230A2 disposed on both sides of the one first conductive line 220A.

One contact gate electrode 240A may be disposed between two adjacent channel structures 230A in the second direction (Y-direction). For example, a contact gate electrode 240A may be disposed between a first active pillar 230A1 included in one channel structure 230A and a second active pillar 230A2 of the channel structure 230A adjacent thereto, the contact gate electrode 240 may be shared by the first active pillar 230A1 and the second active pillar 230A2 disposed on both sidewalls thereof. A gate insulating layer 250A may be disposed between the contact gate electrode 240A and the first active pillar 230A1 and between the contact gate electrode 240A and the second active pillar 230A2. The plurality of second conductive lines 242A may extend in the first direction (X-direction) on the upper surface of the contact gate electrode 240A. The plurality of second conductive lines 242A may function as word lines of the integrated circuit device 200A.

A storage contact 260A may be disposed on the channel structure 230A. The storage contact 260A may be disposed on the second source/drain region SD2, and the data storage structure 280 may be disposed on the storage contact 260A.

In the integrated circuit device 200A, the data storage structure 280 may have the same or similar configuration to that shown in FIGS. 11-13, including a lower electrode 282, a dielectric structure 284, and an upper electrode 286. The dielectric structure 284 may include a mixed layer in which a second material different from the first material is disposed in an opening of the first material. Here, as in the embodiment of FIGS. 11-13, any of the same or similar example structures described above for the dielectric structure 180 may be used for the dielectric structure 284.

Figure 16:
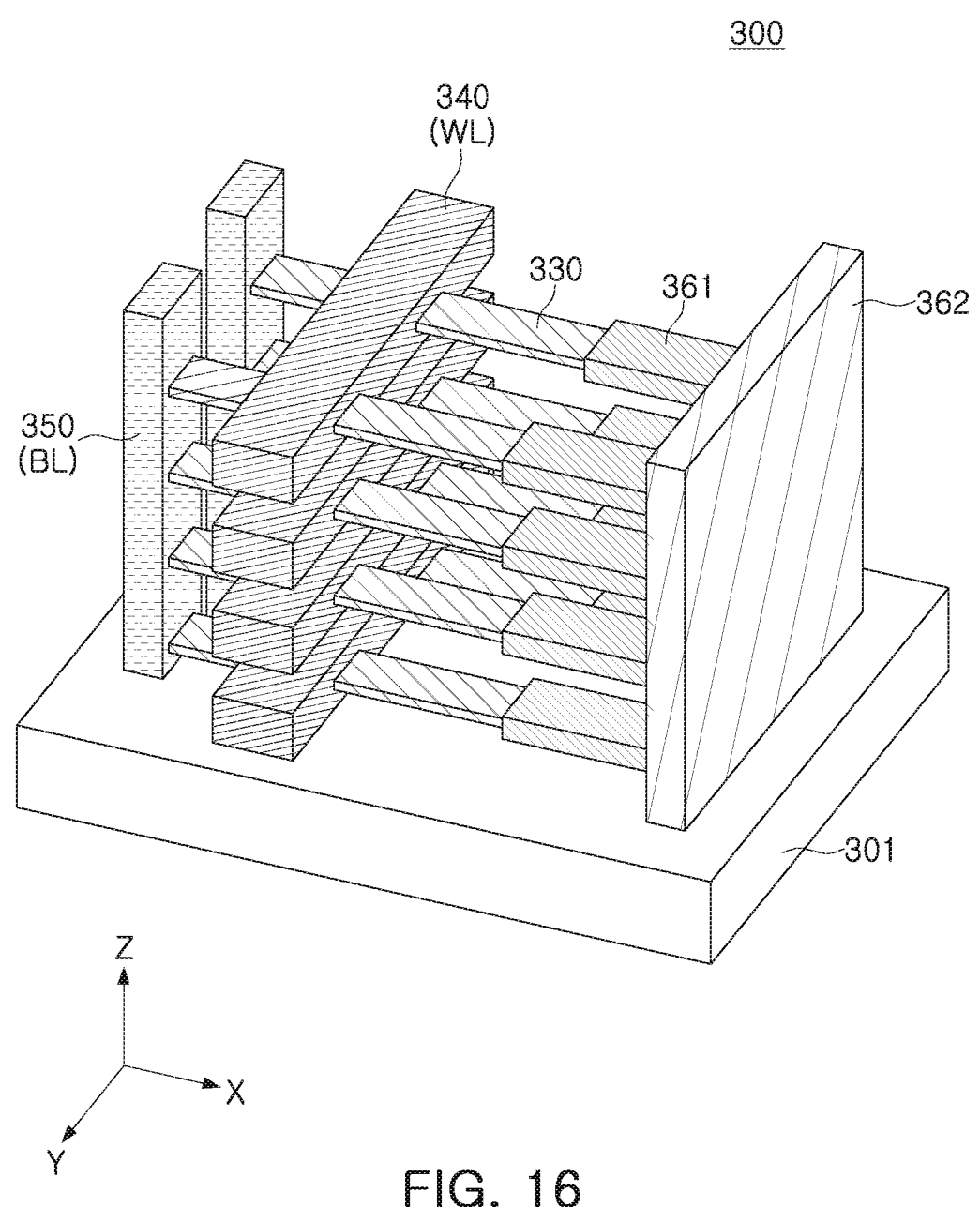
FIG. 16 is a perspective view illustrating a semiconductor device according to an example embodiment of the present disclosure.

FIG. 16 is a perspective view of a semiconductor device according to an example embodiment.

Figure 17:
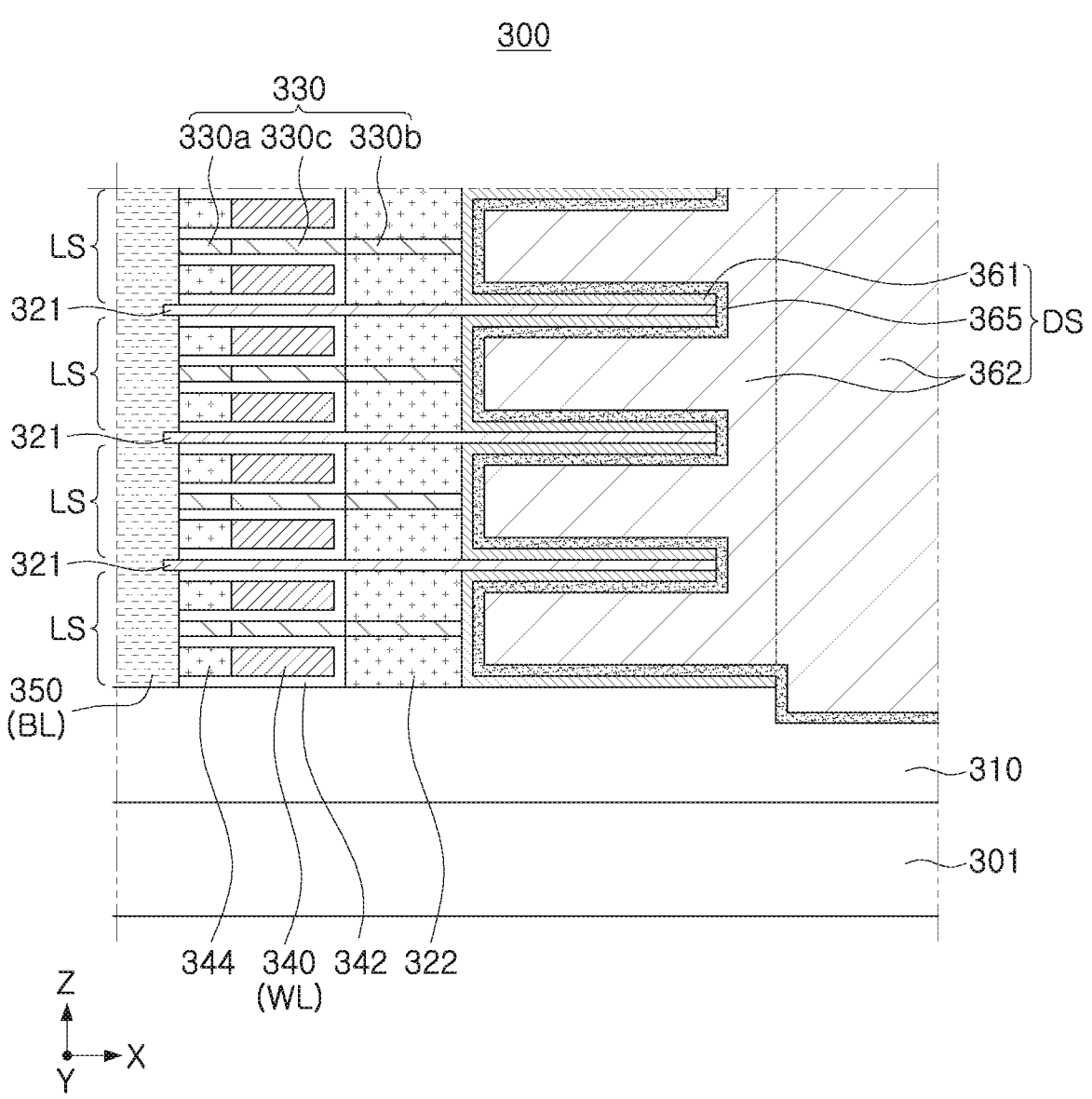
FIG. 17 is a cross-sectional view illustrating a semiconductor device according to an example embodiment of the present disclosure.

FIG. 17 is a cross-sectional view illustrating a semiconductor device, 300, according to an example embodiment, illustrating a region corresponding to the semiconductor device in FIG. 16. FIG. 17 illustrates a structure of a pair of adjacent sub-cell arrays described with reference to FIG. 16.

Referring to FIGS. 16 and 17, the semiconductor device 300 may include a substrate 301, a lower structure 310 on the substrate 301, a plurality of structures LS and a plurality of first insulating layers 321 alternately stacked on the substrate 301, and a plurality of second conductive patterns 350 spaced apart from each other. Each of the plurality of structures LS may include an active layer 330 extending in the X-direction, a first conductive pattern 340 intersecting the active layer 330 and extending in a Y-direction perpendicular to the X-direction, a gate dielectric film 342 disposed between the active layer 330 and the first conductive patterns 340, the gate capping layer 344 between the first conductive patterns 340 and the second conductive patterns 350, a first electrode 361 of the data storage structure DS, and a second insulating layer 322 between the first conductive pattern 340 and the first electrode 361. The data storage structure DS may further include a dielectric structure 365 between the first electrode 361 and the second electrode 362 (the dielectric film is on the first electrode 361 and the second electrode 362 is on the dielectric structure 365). The X-direction and the Y-direction may be perpendicular to each other and parallel to the upper surface of the substrate 301. The Z-direction may be perpendicular to the X and Y-directions, and may be perpendicular to the upper surface of the substrate 301.

A lower structure 310 may be disposed on the substrate 301. The plurality of structures LS and the plurality of first insulating layers 321 may be stacked on the lower structure 310. The lower structure 310 may include a device region on the substrate 301 and an insulating region covering the device region. The insulating region may include insulating layers including an insulating material, such as, for example, at least one of silicon oxide, silicon nitride, silicon oxynitride, and silicon oxycarbide.

The plurality of structures LS and the plurality of first insulating layers 321 may form a stack structure on the substrate 301. The plurality of structures LS may be disposed between the plurality of first insulating layers 321 and may be spaced apart from each other in the Z-direction by the plurality of first insulating layers 321. The first insulating layer 321 may extend in the X-direction, and an end portion may extend into the second conductive pattern 350. The second insulating layer 322 may be disposed between the first insulating layer 321 and the active layer 330 and between the first conductive pattern 340 and the data storage structure DS. Each of the first insulating layer 321 and the second insulating layer 322 may include an insulating material, such as, for example, at least one of silicon oxide, silicon nitride, silicon oxynitride, and silicon oxycarbide. The first insulating layer 321 may horizontally extend longer than the second insulating layer 322. The thickness of the second insulating layer 322 may be greater than that of the first insulating layer 321.

The active layer 330 may be disposed on the substrate 301 and may extend horizontally in the X-direction. A plurality of the active layers 330 may be stacked and spaced apart from each other in the Z-direction, and the plurality of active layers 330 may be arranged in the Y-direction. The plurality of active layers 330 arranged in the Z-direction may be disposed between each of the plurality of first insulating layers 321. The active layer 330 may have a line shape, a bar shape, or a column shape extending in the X-direction while intersecting the first conductive pattern 340. The active layer 330 may include a semiconductor material such as silicon, germanium, or silicon-germanium.

The active layer 330 may include a first impurity region 330a, a second impurity region 330b, and a channel region 330c. The first impurity region 330a may be electrically connected to the second conductive pattern 350. The second impurity region 330b may be electrically connected to the first electrode 361 of the data storage structure DS. The length of the second impurity region 330b in the X-direction may be longer than the length of the first impurity region 330a in the X-direction. The channel region 330c may be disposed between the first impurity region 330a and the second impurity region 330b. The channel region 330c may overlap the first conductive pattern 340.

The first impurity region 330a and the second impurity region 330b may be formed by doping or implanting impurities into the active layer 330. The first impurity region 330a and the second impurity region 330b may have n-type or p-type conductivity.

A portion of the first impurity region 330a may correspond to a source region of the memory cell transistor MCT in FIG. 1, a portion of the second impurity region 330b may correspond to a drain region of the memory cell transistor MCT in FIG. 1, and the channel region 330c may correspond to the channel of the memory cell transistor MCT in FIG. 1. A portion of the first impurity region 330a may provide a first contact region for directly connecting the source region of the memory cell transistor MCT to the second conductive pattern 350, that is, the bit line BL. A portion of the second impurity region 330b may provide a second contact region for directly connecting the drain region of the memory cell transistor MCT to the data storage element DSE, that is, the data storage structure DS.

In another example, the active layers 130 may include an oxide semiconductor, such as, for example, at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), and indium-tin-zinc oxide (ITZO).

In another example, the active layers 130 may include a two-dimensional material (2D material) in which atoms may form a predetermined crystalline structure and may form a channel of a transistor. The two-dimensional material layer may include at least one of a transition metal dichalcogenide material layer (TMD material layer), a black phosphorous material layer, and a hexagonal boron-nitride material layer (hBN material layer). For example, the two-dimensional material layer may include at least one of BiOSe, Crl, WSe2, MoS2, TaS, WS, SnSe, ReS, β-SnTe, MnO, AsS, P(black), InSe, h-BN, GaSe, GaN, SrTiO, MXene, and Janus 2D materials which may form the two-dimensional material.

In another example, the structure LS may further include epitaxial layers connected to the first region 130a and the second region 130b of the active layer 130 and grown from the active layer 130.

The first conductive pattern 340 may be disposed on the substrate 301 and may extend horizontally in the Y-direction. A plurality of first conductive patterns 340 may be stacked and apart from each other in the Z-direction and a plurality of first conductive patterns 340 may be arranged in the X-direction. The first conductive pattern 340 may be disposed between the channel region 330c of the active layer 330 and the first insulating layer 321. The first conductive pattern 340 may be disposed on the upper and lower surfaces 330US and 330LS of the active layer 330. The first conductive pattern 340 may have a line shape, bar shape, or column shape intersecting the second conductive pattern 350 and extending in the Y-direction. Although not illustrated, the plurality of first conductive patterns 340 stacked in the Z-direction within one memory cell may extend to different lengths in the Y-direction in order to provide a contact region in which each upper surface is exposed.

The first conductive pattern 340 may include a conductive material, and the conductive material may include at least one of a doped semiconductor material, a conductive metal nitride, a metal, and a metal-semiconductor compound. The first conductive pattern 340 may also be referred to as a "gate electrode."

The gate dielectric film 342 may be disposed between the first conductive pattern 340 and the active layer 330. The gate dielectric film 342 may be formed between adjacent first insulating layers 321 to have a substantially conformal thickness in an inner space of a gap region formed by etching the second insulating layer 322 from the side surface. The gate dielectric film 342 may include silicon oxide, silicon nitride, or a high-k material.

The gate capping layer 344 may be disposed to fill a region formed by partially etching the first conductive pattern 340 from the side surface. For example, a side surface of the gate capping layer 344 may be in contact with a side surface of the first conductive pattern 340, and upper and lower surfaces of the gate capping layer 344 may be covered by the gate dielectric film 342. The gate capping layer 344 may electrically insulate the first conductive pattern 340 and the second conductive pattern 350.

The second conductive pattern 350 may extend vertically on the substrate 301 in the Z-direction. A plurality of second conductive patterns 350 may be arranged in the Y-direction. The second conductive pattern 350 may be disposed adjacent to the first impurity region 330a and the first end surface of the active layer 330. The second conductive pattern 350 may have an inclined inner surface facing the inclined side surfaces of the first epitaxial layer 335a. A plurality of active layers 330 stacked in the Z-direction may be electrically connected to one second conductive pattern 350. The second conductive pattern 350 may have a line shape, a bar shape, or a column shape extending in the Z-direction. Although not illustrated, the semiconductor device may further include an upper wiring disposed on the second conductive pattern 350, connected to the second conductive pattern 350, and extending in the X-direction. The second conductive pattern 350 may include at least one of a doped semiconductor material, a conductive metal nitride, a metal, and a metal-semiconductor compound.

The data storage structure DS may be disposed adjacent to the second impurity region 330b and the second end surface of the active layer 330. The data storage structure DS may be electrically connected to the active layer 330. The data storage structure DS may include a first electrode 361, a dielectric structure 365 on the first electrode 361, and a second electrode 362 on the dielectric structure 365. As illustrated in FIG. 17, the first electrode 361 of the data storage structure DS may have a cylindrical shape. In other embodiments, the first electrode 361 may have a pillar shape.

The first electrode 361 may be formed to have a substantially conformal thickness in an inner space of a gap region formed by etching the second insulating layer 322 from the side surface. The first electrode 361 may be in a state in which a node is isolated for each structure LS by removing a portion on the side surface of the first insulating layer 321 after depositing a conductive material. The first electrode 361 may include at least one of a doped semiconductor material, a conductive metal nitride, a metal, and a conductive metal oxide.

The dielectric structure 365 may conformally cover the first electrode 361. The dielectric structure 365 may cover the protruding portion 361p of the first electrode 361 and may include a protruding portion 365p toward the second electrode 362. The dielectric structure 365 may include a high dielectric material, silicon oxide, silicon nitride, silicon oxynitride, or a combination thereof. However, in example embodiments, the dielectric structure 365 may include oxide, nitride, silicide, oxynitride, or silicide oxynitride including at least one of Hf, Al, Zr, and La.

The second electrode 362 may cover the dielectric structure 365. The second electrode 362 may fill an inner space of the first electrode 361 having a cylindrical shape. The second electrode 362 may include at least one of a doped semiconductor material, a conductive metal nitride, a metal, and a metal-semiconductor compound.

In the semiconductor device 300, the dielectric structure 365 of the data storage structure DS may include a mixed layer in which a second material different from the first material is disposed in an opening of the first material. To this end, any of the same or similar example structures described above for the dielectric structure 180 may be used for the dielectric structure 365 (where the first electrode 361 is akin to the lower electrode 170 and the second electrode 362 is akin to the upper electrode 190).

According to the aforementioned example embodiments, by inducing crystallization of the second dielectric film by increasing a contact region between the first and second dielectric films, a semiconductor device having improved electrical properties and improved reliability may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
a lower structure;
a lower electrode on the lower structure;
an upper electrode surrounding the lower electrode; and
a dielectric structure disposed between the lower electrode and the upper electrode,
wherein:
the dielectric structure includes a first dielectric film including a first material and a second dielectric film including a second material different from the first material,
the first dielectric film includes a first surface in contact with or facing the lower electrode and a second surface opposite the first surface,
the second dielectric film includes at least a portion disposed in an opening of the first dielectric film and extending in a direction from the second surface toward the first surface, and
the first dielectric film includes zirconium oxide, and the second dielectric film includes hafnium oxide.

2. The semiconductor device of claim 1, wherein a thickness of the dielectric structure is about 5 nm to about 50 nm.

3. The semiconductor device of claim 1, wherein a width of the first portion of the second dielectric film is about 1 nm to about 10 nm.

4. The semiconductor device of claim 1, wherein each of the first and second dielectric films includes a material having a dielectric constant of 10 or more.

5. The semiconductor device of claim 1, wherein the first dielectric film further includes one or more of niobium oxide, yttrium oxide, silicon oxide, tantalum oxide, and aluminum oxide, and
the second dielectric film further includes one or more of niobium oxide, yttrium oxide, silicon oxide, tantalum oxide, and aluminum oxide.

6. The semiconductor device of claim 1, wherein each of the first and second dielectric films includes a material having a tetragonal crystal phase.

7. The semiconductor device of claim 6, wherein the first dielectric film includes zirconium oxide having a tetragonal crystal phase, and the second dielectric film includes hafnium oxide having a tetragonal crystal phase.

8. The semiconductor device of claim 7, wherein the first dielectric film further includes zirconium oxide having a cubic crystal phase, and the second dielectric film further includes hafnium oxide having a cubic crystal phase.

9. The semiconductor device of claim 1, wherein the at least a portion of the second dielectric film penetrates through a grain boundary of the first dielectric film, the grain boundary being at least part of the opening.

10. The semiconductor device of claim 1, wherein the portion of the second dielectric film is a first portion, and the second dielectric film further includes a second portion extending from the first portion and disposed on the second surface of the first dielectric film.

11. The semiconductor device of claim 10, wherein a portion of the first dielectric film is disposed between a lower surface of the first portion of the second dielectric film and the lower electrode.

12. The semiconductor device of claim 10, wherein a single material layer having the same material as the first dielectric film is disposed between the second portion of the second dielectric film and the upper electrode.

13. A semiconductor device, comprising:
a lower structure including a transistor; and
a capacitor structure disposed on the lower structure and electrically connected to the transistor,
wherein the capacitor structure includes a lower electrode electrically connected to the transistor and spaced apart from each other on the lower structure, an upper electrode surrounding the lower electrode, and a dielectric structure disposed between the lower electrode and the upper electrode,
wherein:
the dielectric structure includes a first dielectric film including a first material and a second dielectric film including a second material different from the first material,
the second dielectric film has a lower surface in contact with or facing the lower electrode, an upper surface opposite the lower surface, and a side surface,
the side surface of the second dielectric film is in contact with the first dielectric film, and
a crystal structure of the second dielectric film is the same as that of the first dielectric film.

14. The semiconductor device of claim 13, wherein at least a portion of the side surface of the second dielectric film has a curved shape.

15. The semiconductor device of claim 14, wherein a side surface of the second dielectric film has an outwardly curved region and an inwardly curved region.

16. A semiconductor device, comprising:
a lower structure including a transistor; and
a capacitor structure disposed on the lower structure and electrically connected to the transistor,
wherein the capacitor structure includes a lower electrode electrically connected to the transistor and spaced apart from each other on the lower structure, an upper electrode surrounding the lower electrode, and a dielectric structure disposed between the lower electrode and the upper electrode,
wherein:
the dielectric structure includes a first dielectric film including a first material and a second dielectric film including a second material different from the first material,
the dielectric structure has a first surface in contact with or facing the lower electrode and a second surface in contact with or facing the upper electrode,
at least a portion of the first dielectric film and at least a portion of the second dielectric film are alternately disposed in a direction parallel to the first surface and the second surface between the first surface and the second surface of the dielectric structure, and
a crystal structure of the second dielectric film is the same as that of the first dielectric film.

17. The semiconductor device of claim 16, wherein the capacitor structure further includes an interfacial layer disposed between the dielectric structure and the upper electrode and/or between the dielectric structure and the lower electrode.

18. The semiconductor device of claim 16, wherein, in at least a portion of the first dielectric film and at least a portion of the second dielectric film which are alternately disposed, a width of at least a portion of the second dielectric film is greater than a width of at least a portion of the first dielectric film.

* * * * *